United States Patent [19]

Chen et al.

[11] Patent Number: 5,523,542

[45] Date of Patent: Jun. 4, 1996

[54] METHOD FOR MAKING DYNAMIC RANDOM ACCESS MEMORY CELL CAPACITOR

[75] Inventors: Anchor Chen, Ping-Tung; Gary Hong, Hsinchu, both of Taiwan

[73] Assignee: United Microelectronics Corp., Hsinchu, Taiwan

[21] Appl. No.: 440,751

[22] Filed: May 15, 1995

[51] Int. Cl.⁶ .............................. B23K 9/00; H01L 21/70; H01G 7/00

[52] U.S. Cl. ..................... 219/121.41; 437/60; 437/919; 29/25.42

[58] Field of Search .......................... 219/121.2, 121.41, 219/121.4, 121.68, 121.69; 437/47, 60, 919; 257/303, 306–309; 29/25.41, 25.42; 361/301.4, 321.1, 321, 2, 321.3, 321.4, 321.5, 322

[56] References Cited

U.S. PATENT DOCUMENTS

| | | | |
|---|---|---|---|
| 5,231,044 | 7/1993 | Jun | 437/52 |
| 5,429,980 | 7/1995 | Yang et al. | 437/52 |

*Primary Examiner*—Bot L. Ledynh
*Attorney, Agent, or Firm*—Ladas & Parry

[57] ABSTRACT

A random access memory (RAM) cell capacitor and its method of fabrication. A bottom electrode plate of the capacitor is provided with a plurality of islands disposed on the surface thereof so as to attain an increase in the capacitance thereof.

5 Claims, 4 Drawing Sheets

METHOD FOR MAKING DYNAMIC RANDOM ACCESS MEMORY CELL CAPACITOR

BACKGROUND OF THE INVENTION

1. Field of the Invention

The invention generally relates to integrated circuit (IC) fabrication, and more particularly relates to a method for fabricating a dynamic random access memory (DRAM) cell capacitor, whose bottom electrode plate is provided with a plurality of islands in its surface for increasing its capacitance.

2. Description of the Related Art

Dynamic random access memory (DRAM) composed of a number of memory cells arranged in array is widely utilized in digital electronic equipment. A conventional memory cell located within the DRAM, as shown in FIG. 1A, comprises metal-oxide semiconductor field-effect transistor (MOSFET) 6 and capacitor 8. The gate region of MOSFET 6 is connected to a word line designated as WL. A pair of source/drain regions are connected to the ground node through capacitor 8 and a bit line designated as BL, respectively. Capacitor 8 is used to store the data and should be provided with enough capacitance to prevent data loss.

A stacked capacitor is a commonly used structure in DRAM cells. Referring to FIG. 1B, field oxide 11, gate electrode 12, and source/drain regions 18 are formed on silicon substrate 10. Silicon dioxide layer 13 is deposited over gate electrode 12 and source/drain regions 18, wherein a contact opening is formed to expose the desired portion of source/drain regions 18. First polysilicon layer 14 (bottom electrode plate of the stacked capacitor), dielectric layer 15, such as nitride/oxide (NO) or oxide/nitride/oxide (ONO) layers, and second polysilicon layer 16 (top electrode plate of the stacked capacitor) are next formed on silicon dioxide layer 13, respectively, so as to construct a cell capacitor. First polysilicon layer 14 is connected with desired source/drain regions 18 through contact opening 130 within silicon dioxide layer 13. Finally, a borophosphosilicate glass (BPSG) 17 is deposited over the cell capacitor serving as a passivation layer. Then, a metal layer 19 is sequentially deposited to contact with one of the source/drain regions 18 via a contact opening thereof.

Since the device density on integrated circuits is now approaching that of VLSI, or even ULSI, the feature size of the DRAM cell is getting smaller, resulting in a smaller capacitor and hence less capacitance. Hence, there are two methods to increase the capacitance: (I) decrease the effective dielectric thickness and (II) increase surface area of the electrode plate of the capacitor. When the effective dielectric thickness is decreased, however, greater capacitance can be obtained but seriously degrading the device retention time because dielectric films thinner than 50 Å presently have excessive leakage currents attributed to direct carrier tunneling. For a given capacitor dielectric film, the larger the surface area of the storage electrodes, the higher the capacitance. Using trenched capacitors for DRAM cells is another scheme for increasing capacitance. The trenched capacitor is formed within a trench nearby a transistor device. However, this kind of capacitor suffers from a reduced etch rate for high-aspect-ratio trenches, and thus the processing requires massive amounts of time and hence is expensive. Also, inevitable crystalline defects occur by means of this process.

SUMMARY OF THE INVENTION

It is therefore an object of the present invention to provide a DRAM cell capacitor which has a larger electrode plate surface so that its capacitance is increased.

In accordance with the object of this invention, a capacitor is disposed on an insulating layer having a contact opening to connect with the source/drain region of a transistor. The capacitor includes a bottom electrode plate disposed over the insulating layer and connected to the source/drain region of the transistor via the contact opening. The surface configuration of the bottom electrode plate has a plurality of islands. A dielectric layer is disposed along the surface configuration of the bottom electrode plate. A top electrode plate is disposed over the dielectric layer. The first conducting plate is thereby provided with a plurality of islands so as to increase the capacitor surface area, and in turn, increase the capacitance.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENT

The preferred embodiment of the present invention will now be described with reference to FIGS. 2A to 2G.

Figure 1A:
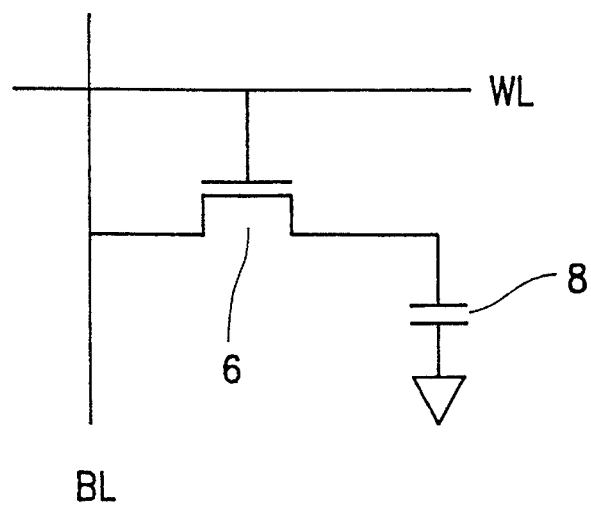
FIG. 1A is a schematic circuit diagram illustrating a memory cell of a DRAM device.
Figure 1B:
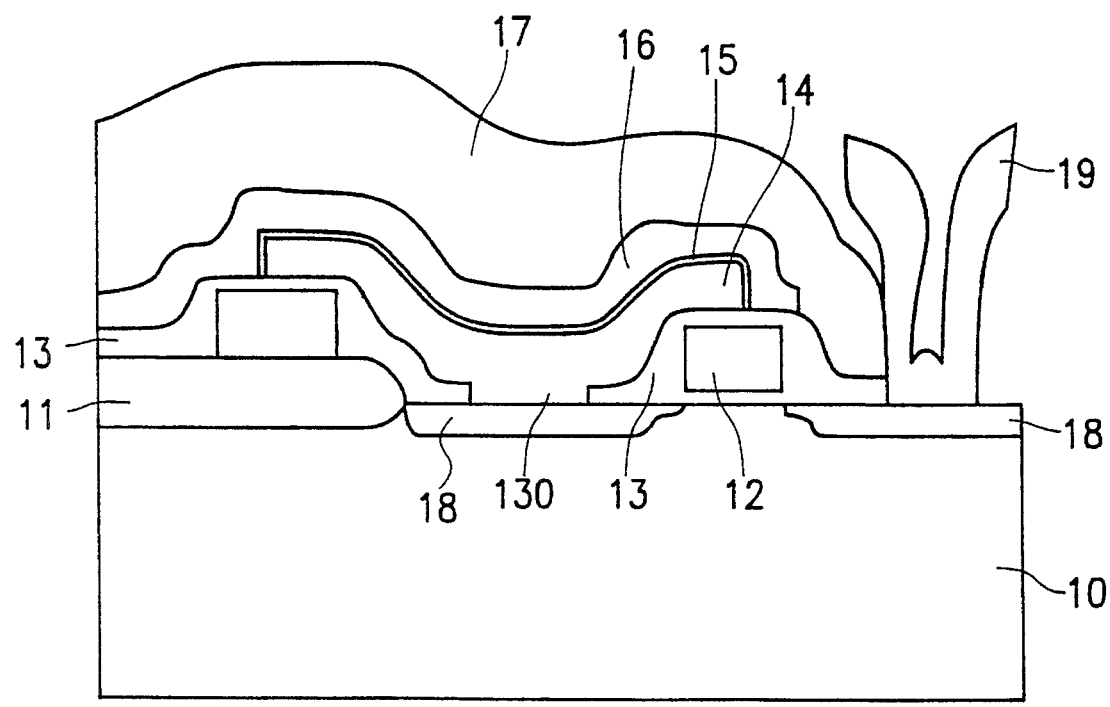
FIG. 1B is a cross sectional view of a conventional stacked capacitor within a DRAM device.
Figure 2A:
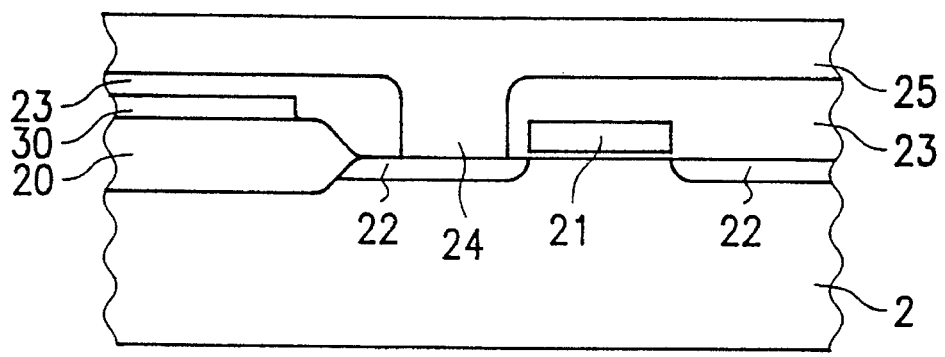
FIGS. 2A–2G illustrate, in cross-sectional views, a sequence of fabrication process steps for the construction of a DRAM cell capacitor in accordance with the present invention.

Referring now more particularly to FIG. 2A, which depicts silicon substrate 2, field oxide layer 20, and a transistor device. The transistor device includes gate electrode 21, interconnection line 30 formed on the field oxide layer 20 and a pair of source/drain regions 22 formed on silicon substrate 2 by conventional processes. Preferably, field oxide layer 20 is formed by the LOCOS method. Insulating layer 23, such as a silicon oxide layer, is formed over field oxide layer 20 and the transistor device preferably by chemical vapor deposition (CVD). By lithography technique, insulating layer 23 is etched and patterned to form contact opening 24 and expose one of desired source/drain regions 22. Bottom conducting layer 25, such as a doped polysilicon layer, is formed over the surface of insulating layer 23, and electrically contacts desired source/drain region 22 through contact opening 24. The thickness of deposited bottom conducting layer 25 ranges from 3000 Å to 6000 Å so as to planarize the surface thereof.

Figure 2B:
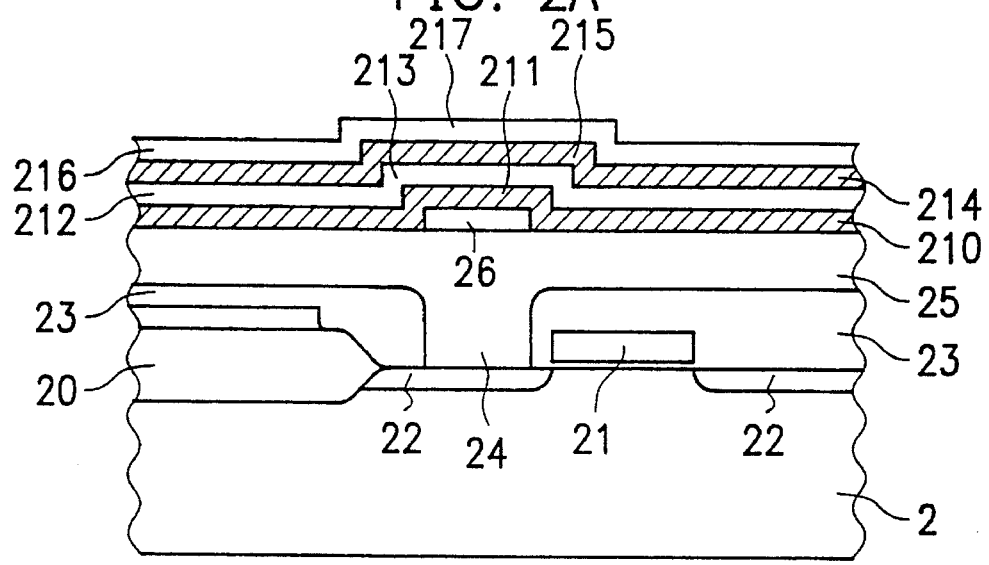

Referring next to FIG. 2B, bottom insulating layer 26, such as a silicon oxide layer, is deposited and patterned to dispose onto the bottom conducting layer 25. Sequentially, first middle conducting layer 210 (e.g., a doped polysilicon layer), first middle insulating layer 212 (e.g., a silicon oxide layer), second middle conducting layer 214 (e.g., a doped polysilicon layer), and second middle insulating layer 216 (e.g., a silicon oxide layer) are formed to cover bottom conducting layer 25 and bottom insulating layer 26. Due to the protrusive configuration of bottom insulating layer 26 deposited on bottom conducting layer 25, all of deposited layers 210, 212, 214, and 216 therefore are provided with raised portions 211, 213, 215, and 217, respectively.

Figure 2C:
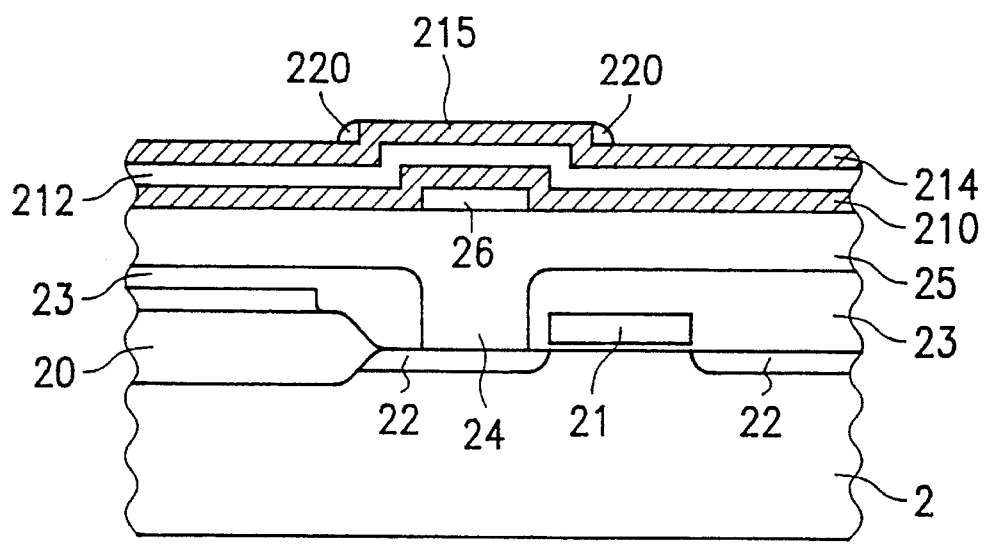

Now turning to FIG. 2C, second middle insulating layer 216 is etched back, preferably by reactive ion etching (RIE), into second spacers 220 on the side walls of the raised portion 215 of second middle conducting layer 214.

Figure 2D:
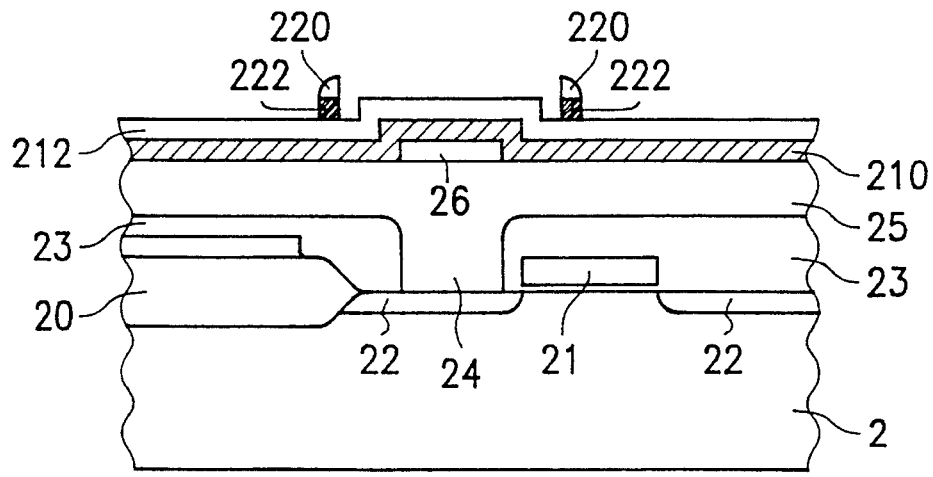

Referring to FIG. 2D, using second spacers 220 as a mask, second middle conducting layer 214 is etched, preferably by reactive ion etching (RIE), into second conducting islands 222 located on first middle insulating layer 212.

Figure 2E:
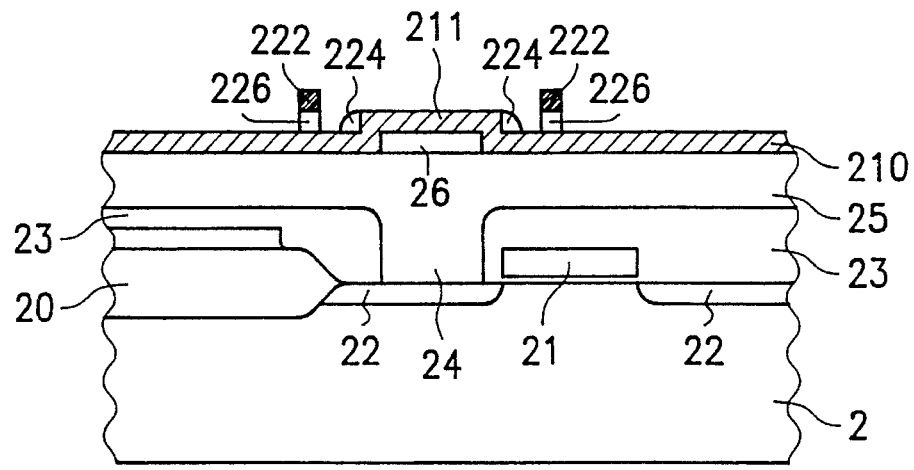

As shown in FIG. 2E, similar to the process depicted in FIG. 2C, first middle insulating layer 212 is etched back, preferably by reactive ion etching, into first spacers 224 on the side walls of raised portion 211 of first middle conducting layer 210, and simultaneously second middle spacer 220 is removed. Moreover, owing to the masking of second conducting island 222, first insulating islands 226 are formed beneath second conducting islands 222.

Figure 2F:
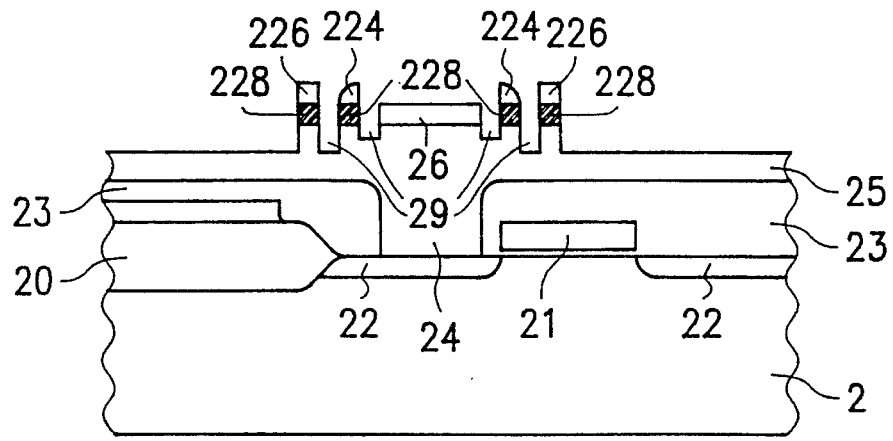

Next referring to FIG. 2F, preferably reactive ion etching (RIE) is employed to remove second conducting island 222 and etch first middle conducting layer 210 into first conducting islands 228 on bottom conducting layer 25 because of the masking of first spacers 224 and first insulating islands 226. Also, this etching process is continually subject to bottom conducting layer 25 therefore to form a plurality of trenches 29 therein.

Figure 2G:
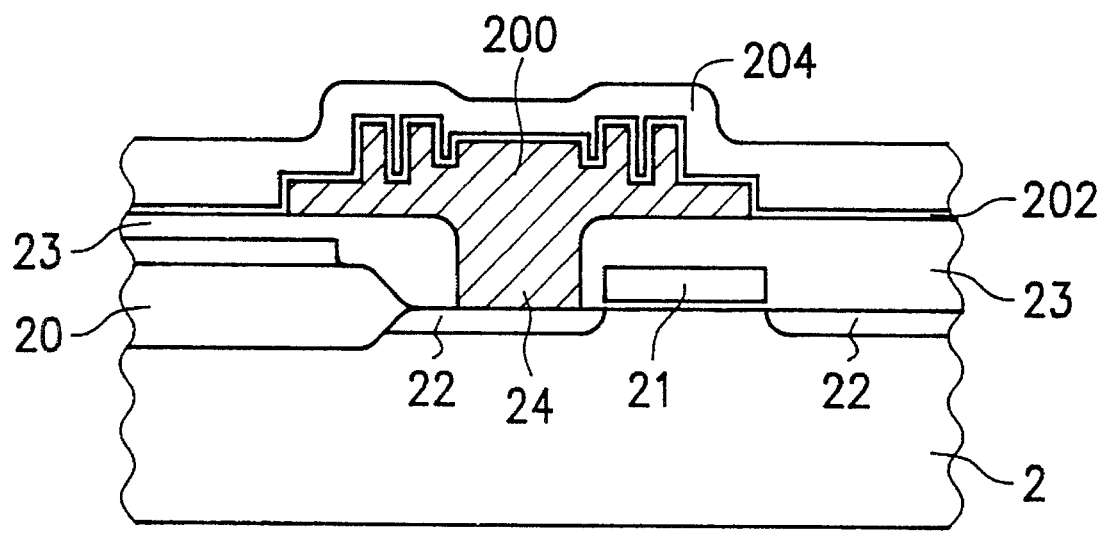

Finally referring to FIG. 2G, first spacers 224, first insulating islands 226, and bottom insulating layer 26 are removed, preferably by RIE or diluted hydrofluoric acid, to expose first middle conducting islands 228. Consequently, a number of the first conducting islands 228 incorporated with bottom conducting layer 25 are etched and patterned, by lithography technique, to form bottom electrode plate 200. Along with the surface configuration of first electrode plate 200, dielectric layer 202, such as nitride/oxide (NO) or oxide/nitride/oxide (ONO), is deposited thereon. Then, top electrode plate 204 (e.g., a doped polysilicon layer) is formed over dielectric layer 202, and, through patterning, connected to the ground node (not shown). The resulting capacitor configuration in accordance with the present invention is depicted in FIG. 2G. Due to the existence of several conducting islands 228, bottom electrode plate 200 is provided with a plurality of islands for increasing the capacitor surface area, and in turn, to increase the capacitance. Moreover, this embodiment only exemplifies two middle conducting layers and two insulating layers alternatively and sequentially deposited to cover the bottom conducting layer and the bottom insulating layer. A number of layers greater than two can be also utilized to fabricate a DRAM cell capacitor with larger capacitance.

Those skilled in the art will appreciate the fact that certain conditions, parameters, as well as materials utilized in the description of the present invention may be changed or modified without departing from the scope and spirit of the present invention disclosure. For example, the invention can be practiced based upon a memory cell having a P-type conductivity substrate and appropriate source/drain dopings. The invention can also be practiced based upon a memory cell having an N-type conductivity substrate and appropriate source/drain dopings. It therefore should be pointed out that the above description, based on the described embodiments of the present invention, is only intended to describe the invention, not to limit the scope of the invention, which is defined in the claims below.

What is claimed is:

1. A method for fabricating a capacitor on an insulating layer having a contact opening to connect with a source/drain region of a transistor comprising the steps of:

(a) forming a bottom conducting layer over said insulating layer to connect with said source/drain region via said contact opening;

(b) forming a bottom insulating layer on a predetermined region of said bottom conducting layer;

(c) sequentially forming at least one middle conducting layer and one middle insulating layer overlying said bottom insulating layer and said bottom conducting layer, each of said at least one middle conducting layer and one middle insulating layer having a raised portion resulting from the step of forming a bottom insulating layer formed;

(d) repeatedly etching back said middle insulating layer into insulating spacers on side walls of said raised portion of said middle conducting layer and patterning said middle conducting layer into conducting islands utilizing said insulating spacers as masking Until said bottom insulating layer is exposed;

(e) removing said insulating spacers and said bottom insulating layer to expose said middle conducting islands on said bottom conducting layer, wherein both of said bottom conducting layer and said islands is confined to form a bottom electrode plate;

(f) forming a dielectric layer over and along a surface configuration of said bottom electrode plate;

(g) forming a top electrode plate over said dielectric layer.

2. The method as in claim 1, between the step (d) and step (e) further comprising the step of continually etching said bottom conducting layer to form a plurality of trenches.

3. The method as in claim 1, wherein said dielectric layer is made of nitride/oxide.

4. The method as in claim 1, wherein said dielectric layer is made of oxide/nitride/oxide.

5. The method as in claim 1, wherein said bottom conducting layer, said middle conducting layer, and said top electrode plate are doped polysilicon.

* * * * *